United States Patent
Chien

(10) Patent No.: US 9,323,366 B2
(45) Date of Patent: Apr. 26, 2016

(54) METHOD FOR CONTROLLING VOLUME OF ELECTRONIC DEVICE AND ELECTRONIC DEVICE USING THE SAME

(71) Applicant: HTC Corporation, Taoyuan County (TW)

(72) Inventor: Chih-Ling Chien, Taoyuan County (TW)

(73) Assignee: HTC Corporation, Taoyuan (TV)

( * ) Notice: Subject to any disclaimer, the term of this patent is extended or adjusted under 35 U.S.C. 154(b) by 409 days.

(21) Appl. No.: 13/898,482

(22) Filed: May 21, 2013

(65) Prior Publication Data
US 2013/0315419 A1 Nov. 28, 2013

Related U.S. Application Data

(60) Provisional application No. 61/651,010, filed on May 24, 2012.

(51) Int. Cl.
*H03G 3/00* (2006.01)
*G06F 3/041* (2006.01)
(Continued)

(52) U.S. Cl.
CPC ............. *G06F 3/041* (2013.01); *G06F 1/1626* (2013.01); *G06F 1/32* (2013.01); *G06F 1/324* (2013.01); *G06F 3/04883* (2013.01); *H03G 7/00* (2013.01); *Y02B 60/1217* (2013.01)

(58) Field of Classification Search
CPC ....... H04M 9/082; H04M 9/08; H04M 3/002; H04M 3/568; H04M 1/72591; H04R 3/02; H04R 3/002; H04R 3/005; H04R 2499/11; H04R 2499/13; H04R 2499/15; H04R 2430/03; H04R 1/1083; H04R 1/1091; H04R 1/406; H04B 3/23; H04B 3/20; H04B 3/234; H04B 3/235; G10L 2021/02082; G10L 2021/02166; G10L 2021/02165; G10L 21/0208; G10L 21/02; G10L 21/0216; G10L 21/0232; G10L 19/012; G10L 19/00; G10L 15/20; G10K 11/16; G10K 11/175; G10K 11/178; G10K 2210/505; G10K 2210/1081; G10K 11/002; G10K 11/346; H03G 3/20; H03G 5/165; H03G 9/025; H03F 2200/03
USPC ......... 381/104, 105, 109, 110, 118, 119, 120, 381/123, 333, 334, 306, 61, 59, 302, 86; 345/177, 158, 156, 157, 159, 173; 700/94
See application file for complete search history.

(56) References Cited

U.S. PATENT DOCUMENTS 7,023,984 B1 4/2006 Short et al.
7,831,054 B2 11/2010 Ball et al.
(Continued)

FOREIGN PATENT DOCUMENTS

CN 101931694 12/2010
CN 101931694 A * 12/2010 .............. H04M 1/60
(Continued)

OTHER PUBLICATIONS

"Office Action of Taiwan Counterpart Application", issued on May 22, 2015, p. 1-p. 15.
(Continued)

*Primary Examiner* — Leshui Zhang
(74) *Attorney, Agent, or Firm* — Jianq Chyun IP Office

(57) ABSTRACT

A method for controlling volume of an electronic device is proposed along with the electronic device using the same. The electronic device has a speaker module, a display and a touch sensor disposed on the display. The method includes the following steps. The touch sensor is driven when the display is disabled from displaying an image. A sensing signal is received from the touch sensor. Inputted information is determined based on the sensing signal. An audio signal of the electronic device is changed according to the inputted information. The changed audio signal is outputted.

21 Claims, 12 Drawing Sheets

(51) Int. Cl.
*H03G 7/00* (2006.01)
*G06F 1/16* (2006.01)
*G06F 1/32* (2006.01)
*G06F 3/0488* (2013.01)

(56) References Cited

U.S. PATENT DOCUMENTS

| | | | |
|---|---|---|---|
| 7,956,847 B2 | 6/2011 | Christie | |
| 2005/0219228 A1* | 10/2005 | Alameh | G06F 1/1626 345/173 |
| 2009/0167699 A1* | 7/2009 | Rosenblatt | G06F 3/044 345/173 |
| 2011/0090160 A1* | 4/2011 | Chen | G06F 3/0412 345/173 |

FOREIGN PATENT DOCUMENTS

| | | | | |
|---|---|---|---|---|
| CN | 101950217 | | 1/2011 | |
| CN | 102236439 | | 11/2011 | |
| CN | 101950217 B | * | 3/2013 | G06F 3/041 |
| TW | 201004295 | | 1/2010 | |
| TW | 201115532 | | 5/2011 | |

OTHER PUBLICATIONS

"Office Action of China Counterpart Application", issued on Sep. 25, 2015, p. 1-p. 8.

* cited by examiner

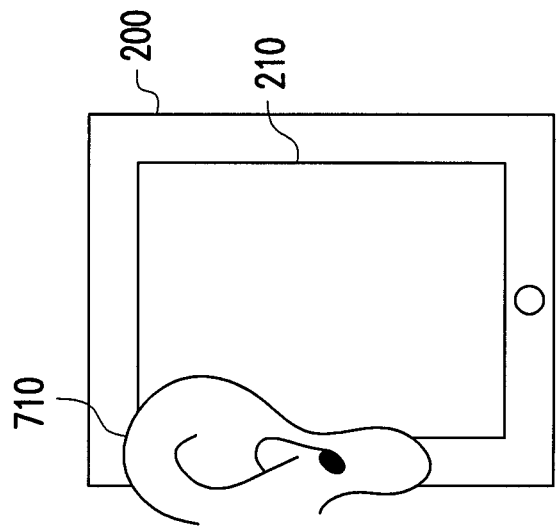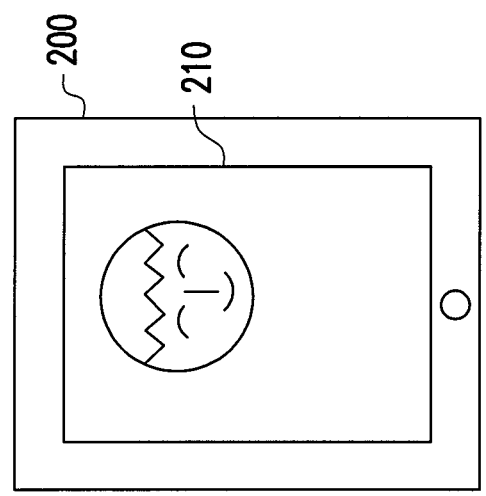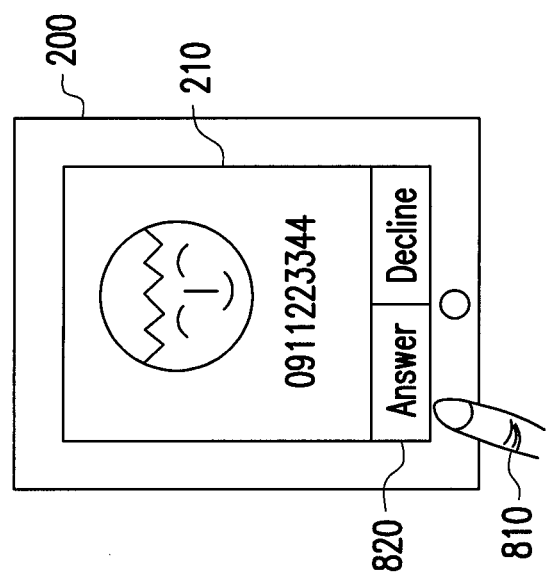

METHOD FOR CONTROLLING VOLUME OF ELECTRONIC DEVICE AND ELECTRONIC DEVICE USING THE SAME

CROSS-REFERENCE TO RELATED APPLICATION

This application claims the priority benefit of U.S. provisional application Ser. No. 61/651,010, filed on May 24, 2012. The entirety of the above-mentioned patent application is hereby incorporated by reference herein and made a part of this specification.

TECHNICAL FIELD

The application relates to a method for controlling volume of an electronic device and the electronic device using the same method.

DESCRIPTION OF RELATED ART

A telephone handset (used for example with a cellular telephone) typically has a handset casing that houses a transceiver and a receiver to allow communication between two points. FIG. 1 is a schematic diagram illustrating a mobile phone device. Referring to FIG. 1, the mobile phone device 100 includes a volume switch actuator 102, and a power button 103. The volume switch actuator 102 is placed at one side of its housing, and configured for the user to manually adjust the volume (i.e., a signal amplitude of audio output signals). The power button 103 may be used for switching operation modes of the mobile phone device 100. The volume adjustment mechanism or button is manufactured separately from the mobile phone device 100's casing, and placement hole(s) are needed to accommodate for the volume adjustment button. The volume adjustment button (corresponding to one of buttons on the volume switch actuator 102) is a separate and distinct part, and when it is combined with the housing, it will result in a protrusion on the surface of the housing. When the user is talking on the phone in a noisy environment, the user may need to press upon the volume adjustment button to increase the volume of the speaker. Alternatively, if the user has previously set audio output volume to a loud volume and the user moves to a quiet environment, the user may need to press upon the volume adjustment button to decrease the volume of the speaker in order to prevent the resulting speaker volume from startling or disturbing people in the local vicinity. The aforementioned operation method for adjusting audio output volume of a mobile phone device is counterintuitive. The user needs to locate the button position based on the protrusion on the housing surface, and the user might mistakenly press a wrong button so an undesired volume change is resulted. Accordingly, it would be desirable to have a telephone handset, which includes a volume adjustment method that controls the volume more efficiently.

SUMMARY

The application is directed to a method for controlling volume of an electronic device and the electronic device using the same method.

The present application provides a method by which mobile device volume may be controlled by touch screen sensor during a telephone call.

A method for controlling volume of an electronic device is proposed. The electronic device has a speaker module, a display and a touch sensor disposed on the display. The method includes the following steps. The touch sensor is driven when the display is disabled from displaying an image. A sensing signal is received from the touch sensor. Inputted information is determined based on the sensing signal. An audio signal of the electronic device is changed according to the inputted information. The changed audio signal is outputted.

An electronic device is proposed in the present application. The electronic device includes a display, a touch sensor, a driving circuitry, a sensing circuitry, a processing unit and a speaker module. The display is configured to display an image. The touch sensor is disposed on the display and configured to detect a contact on the touch sensor and generating a sensing signal when the display is not driven to display the image. The driving circuitry is coupled to the display and the touch sensor and configured to drive the display and the touch sensor. The sensing circuitry is coupled to the touch sensor, configured to receive the sensing signal and determining inputted information based on the sensing signal. The processing unit is coupled to the driving circuitry, the sensing circuitry and speaker module and transmitting an audio signal. The processing unit is configured to adjust the audio signal and output the adjusted audio signal by using a speaker module. When the display is disabled from displaying the image, the sensing circuitry determines the inputted information according to the sensing signal and the processing unit changes the audio signal according to the inputted information.

In order to make the aforementioned and other features and advantages of the application comprehensible, several exemplary examples accompanied with figures are described in detail below.

BRIEF DESCRIPTION OF THE DRAWINGS

The accompanying drawings are included to provide a further understanding of the application, and are incorporated in and constitute a part of this specification. The drawings illustrate examples of the application and, together with the description, serve to explain the principles of the application.

FIGS. 8A-8C, 9A-9B are schematic diagrams respectively illustrating a calling situation according to an exemplary examples.

DETAILED DESCRIPTION OF DISCLOSED EMBODIMENTS

Figure 1:
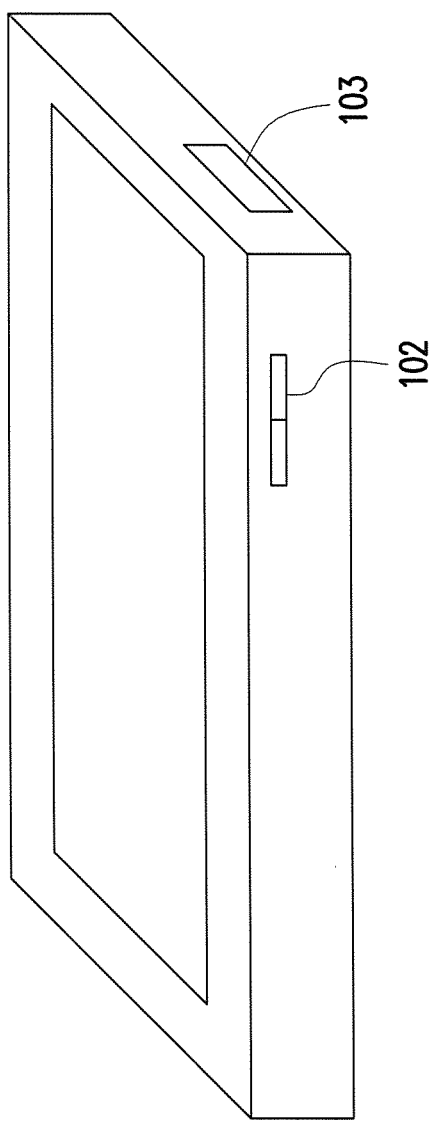
FIG. 1 is a schematic diagram illustrating a mobile phone device.

Some examples of the present application will now be described more fully hereinafter with reference to the accompanying drawings, in which some, but not all examples of the application are shown. Indeed, various examples of the application may be embodied in many different forms and should not be construed as limited to the examples set forth herein; rather, these examples are provided so that this disclosure will satisfy applicable legal requirements. Like reference numerals refer to like elements throughout.

Figure 2:
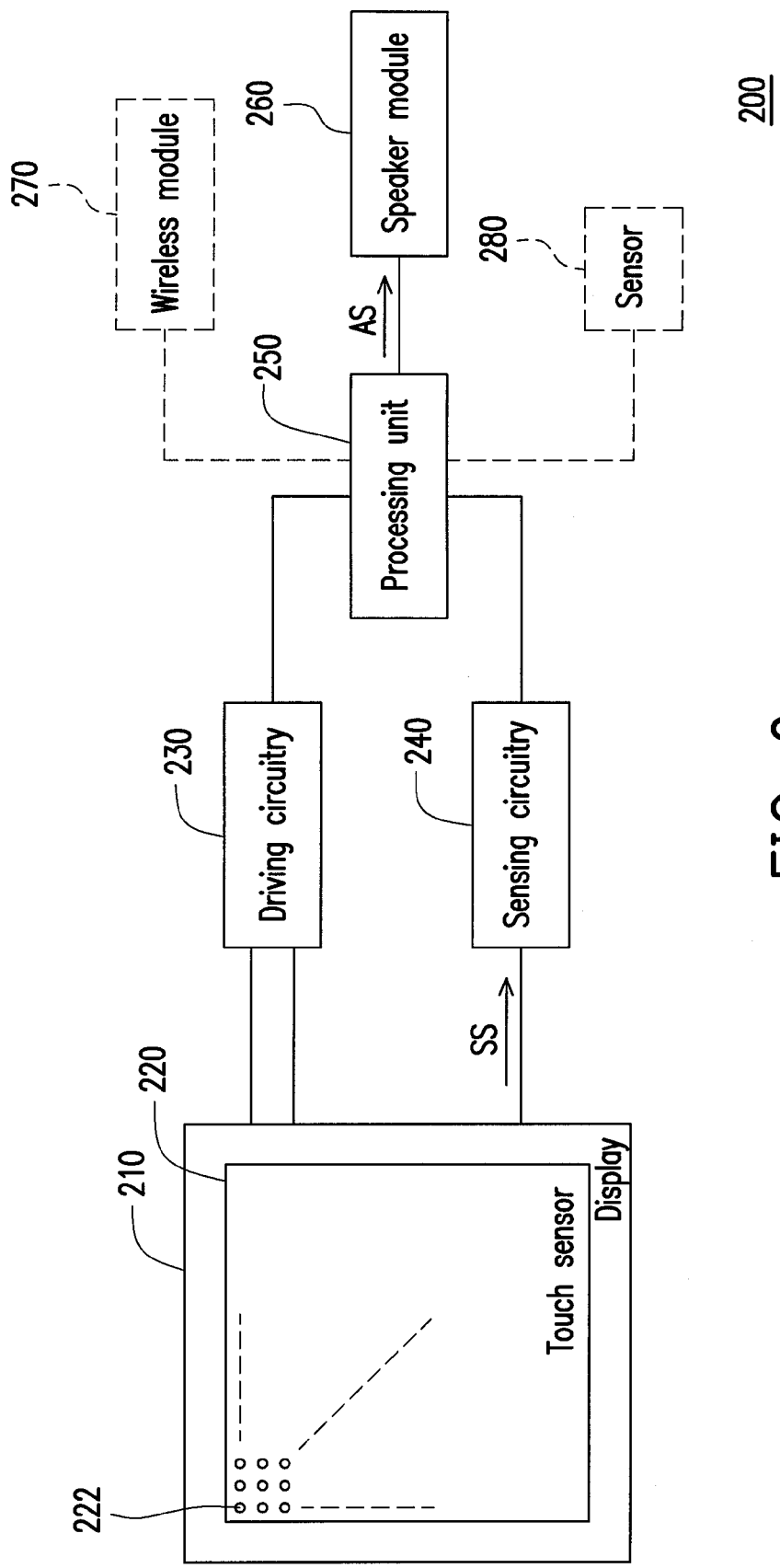
FIG. 2 is a functional block diagram of an electronic device according to an exemplary example of the present application.

FIG. 2 is a functional block diagram of an electronic device according to an exemplary example of the present application. In the present example, the electronic device 200 includes a display 210, a touch sensor 220, a driving circuitry 230, a sensing circuitry 240, a processing unit 250 and a speaker module 260. The electronic device 200 may be a smartphone, a tablet, a personal digital assistant (PDA) or the like. The display 210 may include at least one of a liquid crystal display (LCD), a thin film transistor (TFT)-LCD, an organic light-emitting diode (OLED), a flexible display, a three-dimensional (3D) display and so forth. The touch sensor 220 may be disposed on the display 210 and include sensing elements 222 arranged in rows and columns and configured for receiving touch events or hover events.

The touch event includes a touching of finger, palm, body parts or other objects against a touch-sensitive surface of the touch sensor 220. The hover event includes a hovering of finger, palm, body parts or other object near the touch sensor 220. The sensing elements 222 of the touch sensor 220 can be, for example, capacitive touch sensing elements, resistive touch sensing elements, surface acoustic wave touch sensing elements, electromagnetic touch sensing elements, near field imaging touch sensing elements, and the like. In other examples, the touch sensor 220 may include a first layer of capacitive touch sensing elements integrated with a second layer of proximity sensing elements.

In other examples, the touch sensor 220 may include a capacitive sensing medium having a plurality of row traces (may be referred to be scanning lines) or driving lines and a plurality of column traces or sensing lines, although other sensing media may also be used. The row traces and the column traces may be formed from a transparent conductive medium, such as Indium Tin Oxide (ITO) or Antimony Tin Oxide (ATO), although other transparent and non-transparent materials, such as copper, can also be used. In yet other examples, the row traces and the column traces can be formed on opposite sides of a dielectric material, and can be perpendicular to each other. It is noted that in other examples, the row traces and column traces can be formed on a single side of a substrate, or can be formed on two separate substrates separated by a dielectric material. In some other examples, the dielectric material can be transparent, such as glass, or can be formed from other materials, such as mylar. An additional dielectric cover layer or a reinforced glass layer may be placed over the row traces or the column traces to strengthen the structure and protect the entire assembly from damage.

The driving circuitry 230 is coupled to the display 210 and the touch sensor 220. The driving circuitry 230 is configured to drive the display 210 and the touch sensor 220. The sensing circuitry 240 is coupled to the display 210 and the touch sensor 220. The touch sensor 220 according to one example of this application can detect multiple touches (touch events or contacts) that occur at about the same time (and at different times), and then the sensing circuitry 240 can identify and track locations of the detected touch events or the contact points. The contacts may be provided by any combination of one or more finger, a face, a palm, a pen or a hover-based input to the touch sensor 220, but the application is not limited thereto.

The sensing circuitry 240 may receive the sensing signal SS and determine inputted information based on the received sensing signal SS. The inputted information may be an image, a pattern or a gesture corresponding to the sensing signal SS. The gesture may be defined as any kind of sliding operations occurring on the touch sensor 220 performed by the user, but the application is not limited thereto.

A gesture is a motion of the object/appendage making contact with the touch sensor. The object may be user's figure, palm, ear or any part of user's body. For example, the predefined gesture may include a contact of the touch sensor on the left edge (to initialize the gesture), a horizontal movement of the point of contact to the opposite edge while maintaining continuous contact with the touch sensor, and a breaking of the contact at the opposite edge (to complete the gesture). A sequence of data such as sensing signal relating to the motion of a gesturing is generated. A selected set of data items from the sequence are tested against pre-learned threshold values, to determine a probability of the sequence representing a certain gesture. If the probability is greater than a predetermined value, then the gesture is detected. Such a gesture may be recognized by using a touch sensor divided into a small number of large regions. The gesture is then identified by tracking a presence of the finger in each of the regions over time. The contact may include one or more taps on the touch screen, maintaining continuous contact with the touch sensor, movement of the point of contact while maintaining continuous contact, a breaking of the contact, or any combination thereof.

In some examples, at the "intersections" of the row traces and the column traces in the touch sensor 220, where the traces pass above and below (cross) each other (but do not make direct electrical contact with each other), the traces essentially form two electrodes (although more than two traces could intersect as well). Each intersection of row traces and column traces can represent, for example, a capacitive sensing node and can be viewed as picture element, which can be particularly useful when the touch sensor 220 is viewed as capturing an "image" of touch and hover.

In other words, after the sensing circuitry 240 has determined whether a touch event or a hover event has been detected at some of the sensing elements 222 in the touch sensor 220, the pattern of sensing elements 222 in the touch sensor 220 at which a touch event or a hover event occurred can be viewed as an "image" of touch (e.g., a pattern of fingers touching or hovering the touch sensor 220).

In another example, one or more proximity sensing elements 222 in the touch sensor 220 can be configured to trigger the functionality of deactivating the display 210 without actually making contact with the touch sensor 220. In one specific example, if a cheek of the user is detected near the touch sensor 220 by one or more sensing elements 222 in the touch sensor 220, the display 210 can be deactivated, dimmed or powered down to save power of the electronic device 200.

In some examples, the stimulus inputs which are sequentially applied to each one of the rows in the touch sensor 220 by the driving circuitry 230 can be implemented, but not limited, as a pulse train with a driving frequency or a specific scanning frequency. The stimulus inputs with the driving frequency or the scanning frequency are configured for periodically charging the sensing elements 222 in the touch sensor 220. If a sensing element is charged by the stimulus inputs, the sensing element will be activated to be able to sense the touch events or the hover events. On the other hand, if a sensing element is not charged by the stimulus inputs, the sensing element's abilities of sensing the touch events or the hover events are disabled, i.e., the sensing element is deactivated.

The processing unit 250 may be coupled to the driving circuitry 230 and the sensing circuitry 240. The processing unit 250 may be a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Array (FPGAs) circuits, any other type of integrated circuit (IC), a state machine, an ARM-based processor, and the like.

The processing unit 250 may receive the input signals from the sensing circuitry 240 and may be configured for performing actions based on the outputs that may include, but are not limited to, moving an object such as a cursor or pointer, scrolling or panning, adjusting control settings, opening a file or document, viewing a menu, making a selection, executing instructions, operating a peripheral device connected to the host device, answering a telephone call, placing a telephone call, terminating a telephone call, operation on voice-over-Internet packet voice call (VoIP call), changing the volume or audio settings, storing information related to telephone communications such as addresses, frequently dialled numbers, received calls, missed calls, logging onto a computer or a computer network, permitting authorized individuals access to restricted areas of the computer or computer network, loading a user profile associated with a user's preferred arrangement of the computer desktop, permitting access to web content, launching a particular program, encrypting or decoding a message, and/or the like.

In some examples, the processing unit 250 may be further coupled to a wireless module 270. The wireless module 270 may be a communication module, which could receive data from a network and transmit the data to the processing unit 250 to generate an audio signal AS. The network may be a typical telecommunication network, the Internet or the like. To be specific, when the user is using the electronic device 200 to perform a communication procedure with another user, the wireless module 270 may receive the data related to the communication procedure from the network, and then transmit the data to the processing unit 250. After receiving the data, the processing unit 250 may correspondingly generate the audio signal AS according to the data. For example, when the user is using the electronic device 200 to make a telephone call through the telecommunication network, the wireless module 270 may receive the data related to the telephone call from the telecommunication network and transmit the data to the processing unit 250. For another example, when the user is using the electronic device 200 to make a telephone call through some Internet communication applications (or software), the wireless module 270 may receive the data related to the telephone call from the Internet and transmit the data to the processing unit 250.

In some examples, the wireless module 270 may be configured for processing the radio frequency (RF) signals of the cellular communication technologies, e.g., global system for mobile (GSM), third generation project partnership long term evolution (3GPP LTE), code division multiple access (CDMA), wideband CDMA (WCDMA), high speed packet access (HSPA), and world interoperability for microwave access (WiMAX), etc. Besides, the wireless module 270 may further process the RF signals of wireless local area network (WLAN) communication technologies.

In other examples, the wireless module 270 may transmit wireless signals (e.g., RF signals) to or receives wireless signals from at least one base station, an external communication terminal, and a server through a mobile communication network. The wireless signals (e.g., the RF signals) may include various types of data according to whether the electronic device 200 transmits/receives voice call signals, video call signals, data packets or text/multimedia messages. Besides, the wireless module 270 may be a communication module, which is configured for wirelessly accessing the Internet through a wireless local area network. The wireless module 270 may be embedded in electronic device 200 or may be installed in an external device. The wireless module 270 may use various wireless local area network technologies such as wireless fidelity (Wi-Fi) standard or IEEE 802.11 standard.

The speaker module 260 may be coupled to the processing unit 250 and the processing unit 250 may be configured to generate the audio signal AS by decoding the data received by the wireless module 270. The speaker module 260 may be the speaker or the speakerphone of the electronic device 200, which could output sounds in response to the audio signal AS. Alternatively, the processing unit 250 may further comprise an audio amplifier coupled to a speaker module 260, or an audio filter coupled to the speaker module 260.

The speaker module 260 may output audio signals received by the wireless module 270 during a telephone call reception mode, a telephone call mode, a recording mode, a voice recognition mode, or a broadcast reception mode or may output audio signals present in the memory of the electronic device 200. In addition, the speaker module 260 may output various sound signals associated with the functions of the electronic device 200 such as receiving a telephone call or a message. The speaker module 260 may include a speaker or a buzzer.

In some examples, the electronic device 200 may further include a sensor 280, coupled to the processing unit 250. In some examples, the sensor 280 may include one or more proximity sensors. The proximity sensor according to some examples may include resistive touch sensors, surface acoustic wave touch sensors, electromagnetic sensor, near field imaging touch sensors, light sensor and the like.

A proximity sensor is a sensor which may be able to detect the presence of nearby objects without any physical contact. For example, a proximity sensor may emit an electromagnetic field or a beam of electromagnetic radiation (infrared, for instance), and looks for changes in the field or return signal. The object being sensed by the proximity sensor may be referred to as the proximity sensor's target. Different proximity sensor targets demand different sensors. For example, a capacitive or photoelectric sensor might be suitable for a plastic target; an inductive proximity sensor always requires a metal target. The maximum distance that this sensor can detect is defined "nominal range". Some sensors have adjustments of the nominal range or means to report a graduated detection distance. Proximity sensors may have a high reliability and long functional life because of the absence of mechanical parts and lack of physical contact between sensor and the sensed object. Fro example, International Electrotechnical Commission (IEC) 60947-5-2 defines the technical details of proximity sensors. A proximity sensor adjusted to a very short range may be used as a touch switch. For example, a proximity sensor may be divided in two halves, and when the two halves move away from each other, then a signal may be activated a controller connected to the proximity sensor.

The sensor 280 may sense a property of an object or an environment external to the electronic device 200 and generating a sensing information based on the sensed property. The processing unit 250 may determine whether to drive the touch sensor 220 based on the sensing information when the display 210 is not driven to display the image. The sensing information may be an electrical signal as a function of the property of an object sensed by the sensor 280 or the environment external to the electronic device 200 imposed on the sensor.

Figure 3:
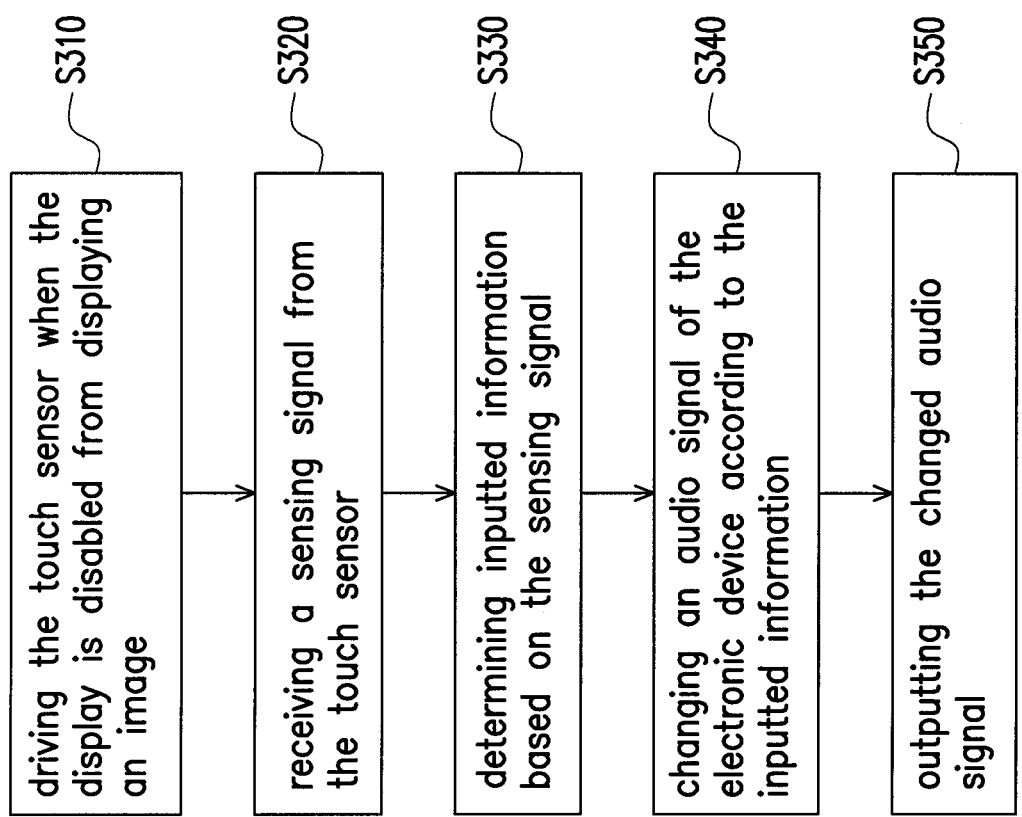
FIG. 3 is a flow chart illustrating the method of controlling volume of the electronic device according to an exemplary example of the present application.

FIG. 3 is a flow chart illustrating the method of controlling volume of the electronic device according to an exemplary example of the present application. Referring to both FIG. 2 and FIG. 3, the proposed method of controlling volume of the electronic device may be adapted for the electronic device 200, but the application is not limited thereto.

In step S310, the driving circuitry 230 may drive the touch sensor 220 when the display 210 is disabled from displaying an image. For example, when the user is making a telephone call through the electronic device 200, the user may put the electronic device 200 near his/her ear. At this moment, since the user may focus on talking to the electronic device 200, the user may not care the displaying condition of the display 210. Therefore, the driving circuitry 230 may disable (or deactivate) the display 210 for saving the power consumption of the electronic device 200. In other words, the detection functionality of the touch sensor 220 may still remain active after the telephone call is established. Besides, after the telephone call is established, the driving circuitry 230 may change a driving frequency or a scanning frequency of the sensing elements 222 in the touch sensor 220. Alternatively, the driving circuitry 230 may adjust the sensing elements 222 of the touch sensor 220 through driving a portion of the touch sensor 220, partially charging the sensing elements 222 in the touch sensor 220, partially charging the sensing elements 222 in some area of the touch sensor 220, or deactivating the sensing elements 222 in some area of the touch sensor 220.

In other examples, the display 210 could be disabled according to the sensing information sensed by the sensor 280. In detail, when the electronic device 200 is coupled to the network (e.g., the telecommunication network or the Internet) for receiving a data encoded with the audio signal AS, the processing unit 250 may determine whether an object (e.g., a face, a palm, a cheek, etc.) is proximate to the electronic device 200 according to the sensing information provided by the sensor 280. If yes, the processing unit 250 may determine that the user may be, for example, speaking to the electronic device 200 and may not need to see the display condition of the display 210. Hence, the processing unit 250 may control the driving circuitry 230 to disable the display 210 for saving the power consumption of the electronic device 200. The driving circuitry 230 may stop driving the display to disable the display to display image or disable the backlight of the display.

In step S320, the sensing circuitry 240 may receive the sensing signal SS from the touch sensor 220. The sensing signal SS may be generated by the touch sensor 220 when an object touches on the touch sensor 220 (i.e., a touch event occurs) or hovers above the touch sensor 220 (i.e., a hover event occurs). The details of the touch event and the hover event could be referred to the aforementioned discussion, which would not be repeated herein.

In step S330, the sensing circuitry 240 may determine inputted information based on the sensing signal SS. The inputted information (e.g., a gesture or a pattern) may be determined by calculating the sensing signal SS when an object touches on the touch sensor 220 (i.e., a touch event occurs) or hovers above the touch sensor 220 (i.e., a hover event occurs). Besides, the sensing circuitry 240 may determine the inputted information by calculating the sensing signal SS over a period of time. That is, the sensing circuitry 240 would determine the inputted information based on the continually inputted sensing signal SS, instead of determine the inputted information instantly when the sensing signal SS is initially generated. From another point of view, the sensing circuitry 240 may determine the inputted information according to the "image" corresponding the sensing signals SS as mentioned in the previous discussion, whose details would not be repeated herein.

In step S340, the processing unit 250 may change the audio signal AS of the electronic device 200 according to the inputted information. To be specific, the processing unit 250 may change a characteristic of the audio signal and transmit the audio signal AS to the speaker module 260. In other examples, the processing unit 250 may further change a gain of an amplifier or filter in the processing unit for changing the characteristic of the audio signal AS. The characteristic of the audio signal AS may at least includes volume, amplitude, frequency, pitch, or signal to noise ratio, but the application is not limited thereto. In step S350, the speaker module 260 may output the audio signal AS.

From another point of view, while the display 210 is not displaying during, for example, a telephone call, the touch sensor 220 may still be enabled for detecting the inputted information (e.g., a gesture) from the user. After the touch sensor 220 detecting the inputted information, the processing unit 250 may adjust the audio signal AS, such that the characteristic (e.g., volume) of the outputted audio signal AS could be changed.

As a result, the examples of the present application provide a novel method for controlling volume of the electronic device. By maintaining the detecting function of the touch sensor while the display is being disabled (or deactivated), the touch sensor may constantly detect the inputted information from the user while the electronic device is being used for, for example, making a call. To the user, he/she may correspondingly adjust the characteristic (e.g., volume) of the outputted audio signal by inputting information (e.g., a gesture) to the touch sensor during the telephone call. In other words, the example of the present application provides an intuitive way for the user to adjust the characteristic (e.g., volume) of the outputted audio signal.

In some examples, the term "partially charging" in the present application means that only some of the sensing elements 222 in the touch sensor 220 are activated by stimulus inputs, while the others of sensing elements 222 are deactivated sensing elements 222. The arrangement (i.e., the amount and positions) of the activated sensing elements 222 in the touch sensor 220 can be adjusted to be any kinds of combinations. For example, the positions of activated sensing elements 222 can be arranged, but not limited to, as selective rows in the touch sensor 220, as selective columns in the touch sensor 220, with random positions in the touch sensor 220, in the upper half of the touch sensor 220, in the lower half of the touch sensor 220, in the left half of the touch sensor 220, in the right half of the touch sensor 220, near the central region of the touch sensor 220, around the edges of the touch sensor 220, in the regions that the user frequently used in the touch sensor 220, and so forth.

FIGS. 4A-4D are schematic diagrams respectively illustrating four kinds of partially charging mechanisms according to exemplary examples of the present application. Each of the intersections of the rows and columns in FIG. 4A-4D represents one of the sensing elements 222 in the touch sensor 220. Each of intersections in FIG. 4A-4D labelled by large black dots in the touch sensor 220 are the sensing elements 222 currently activated by stimulus inputs, while the other intersections without labelling as the large black dots are the sensing elements 222 without stimulus inputs (i.e., these sensors are currently deactivated).

Figure 4B:
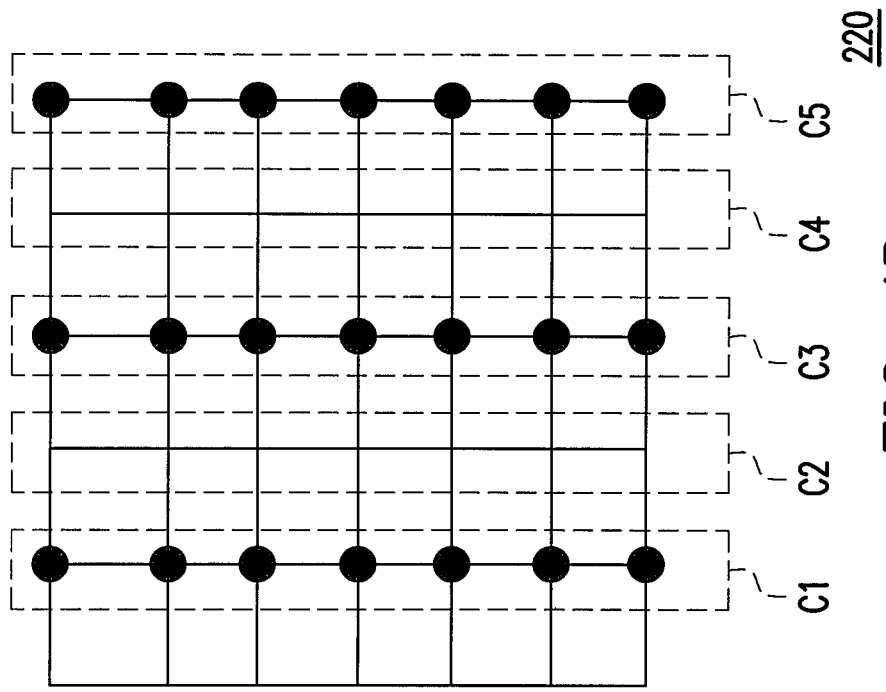
FIGS. 4A-4D are schematic diagrams respectively illustrating four kinds of partially charging mechanisms according to exemplary examples of the present application.
Figure 4A:
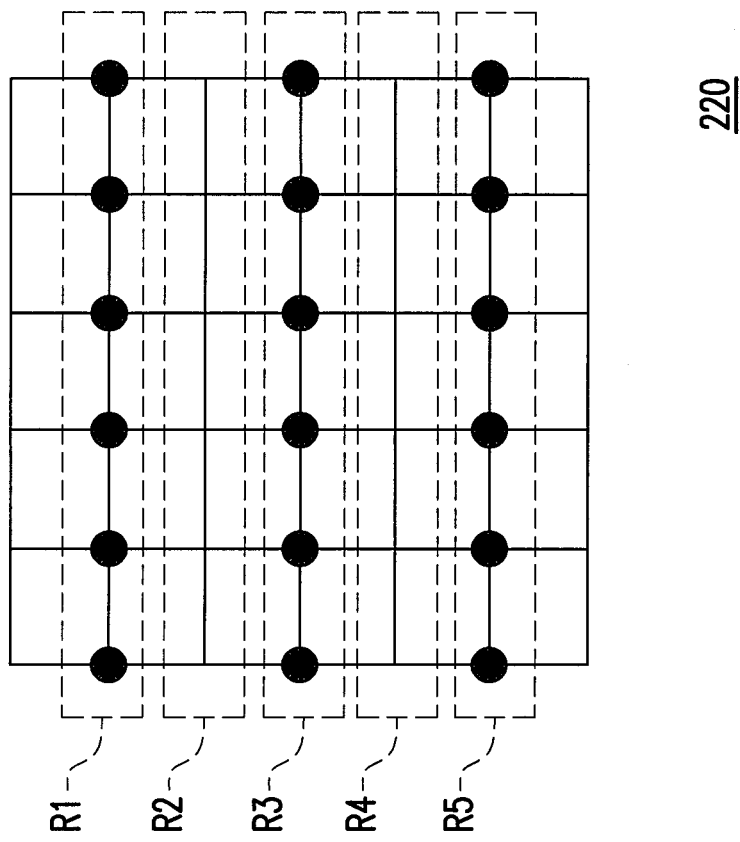

Referring to FIG. 4A, the arrangement of activated sensing elements 222 in the touch sensor 220 is an example of arranging the activated sensing elements 222 as selective rows in the touch sensor 220. The touch sensor 220 is partially charged with rows R1, R3 and R5, that is, the stimulus inputs are only applied to the sensing elements in rows R1, R3 and R5 but not to the sensors in rows R2 and R4. Since the user of the touch sensor 220 may still perform some inputs of other touch events or hover events to the touch sensor 220 when the display 210 is not driven (e.g., the electronic device 200 is in the sleep mode), the partially charging mechanism may enable the touch sensor 220 to maintain the detection functionality with lower power consumption.

Referring to FIG. 4B, the arrangement of activated sensing elements 222 in the touch sensor 220 is an example of arranging the activated sensing elements 222 as selective columns in the touch sensor 220. The touch sensor 220 is partially charged with columns C1, C3 and C5, that is, the stimulus inputs are only applied to the sensing elements in columns C1, C3 and C5 but not to the sensing elements in columns C2 and C4.

Figure 4D:
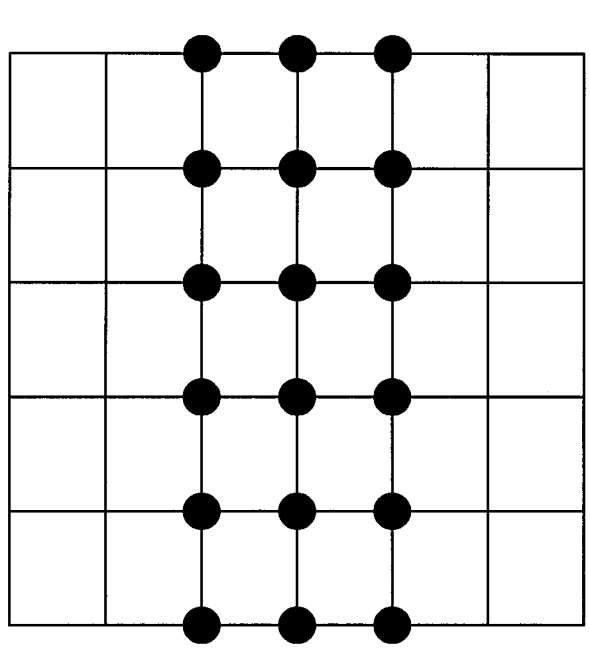
Figure 4C:
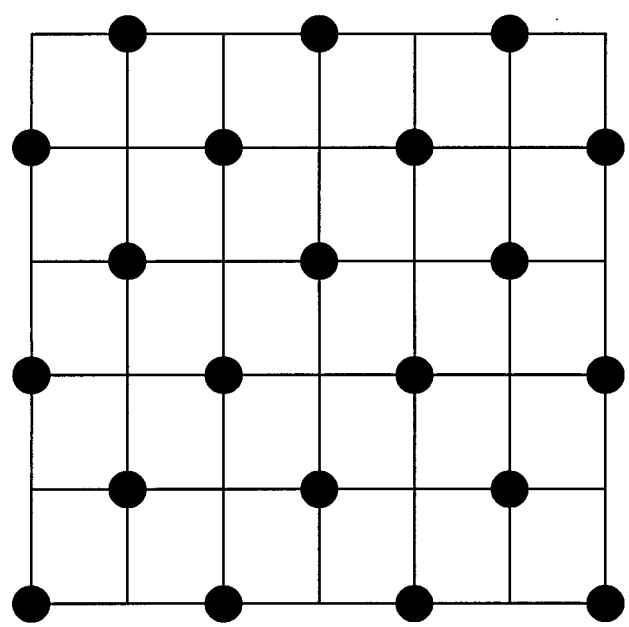

Referring to FIG. 4C, FIG. 4C illustrates another kind of arrangement of activated sensing elements 222 in the touch sensor 220. In a particular row of the touch sensor 220 in FIG. 4C, every two activated sensing elements are spaced by one deactivated sensing element. In a particular column of the touch sensor 220 in FIG. 4C, every two activated sensing elements are also spaced by one deactivated sensing element.

Referring to FIG. 4D, the arrangement of activated sensing elements 222 in the touch sensor 220 is an example of arranging the activated sensing elements near the central region of the touch sensor 220. The arrangement of activated sensing elements in FIG. 4D also can be regarded as another kind of arranging the activated sensing elements as selective rows in the touch sensor 220. In some examples, the user of the electronic device 200 may be accustomed to use a specific region of the touch sensor 220, that is, some regions in the touch sensor 220 may be frequently used by the user. Generally speaking, those frequently used regions may locate more likely, but not limited to, near the central region of the touch sensor 220, instead of locating around the edges of the touch sensor 220. In this scenario, the arrangement as illustrated in FIG. 4D may enable more accurate sensing abilities than the arrangement as illustrated in FIG. 4A, although the amounts of activated sensors in the two figures may be the same.

In some examples, the processing unit 250 may decide how to correspondingly adjust the characteristic of the outputted audio signal AS by determining whether the inputted information is matched to predetermined information. The predetermined information may be a gesture stored in the memory of the electronic device. The gesture may be setup by the user of the electronic device. The user may input the gesture to the electronic device and store the inputted gesture as predetermined information or predetermined gesture. It is noted that the main idea of the information matching determination should be based on whether the "image" of the touch events or the hover events (i.e., the inputted information) matches the predetermined information. In some examples, the predetermined information may include, but not limited to, triangles, circles, hexagons, squares, rectangles, parallelogram, diamond, star or any other geometrical shapes which can be input by finger, palm, body parts or other objects. The predetermined information may also include, but not limited to, words, lines, alphabets, scribbling, drawings, dots or any other information, which can be input by finger, palm, body parts or other objects.

In some examples, the characteristics (e.g., scale, orientation, order of drawing, position of drawing, etc.) of the inputted information of the touch events or the hover events may not be completely matched to the predetermined information. Nevertheless, as long as the inputted information of the touch events or the hover events can "roughly" or "approximately" match the predetermined information, the inputted information of the touch events or the hover events will be determined to be valid. That is, the inputted information will be determined by the processing unit 250 to be matched to the predetermined information, even the scale, the orientation, the order of drawing or position of drawing of the inputted information may be slightly different from the predetermined information.

Figure 5B:
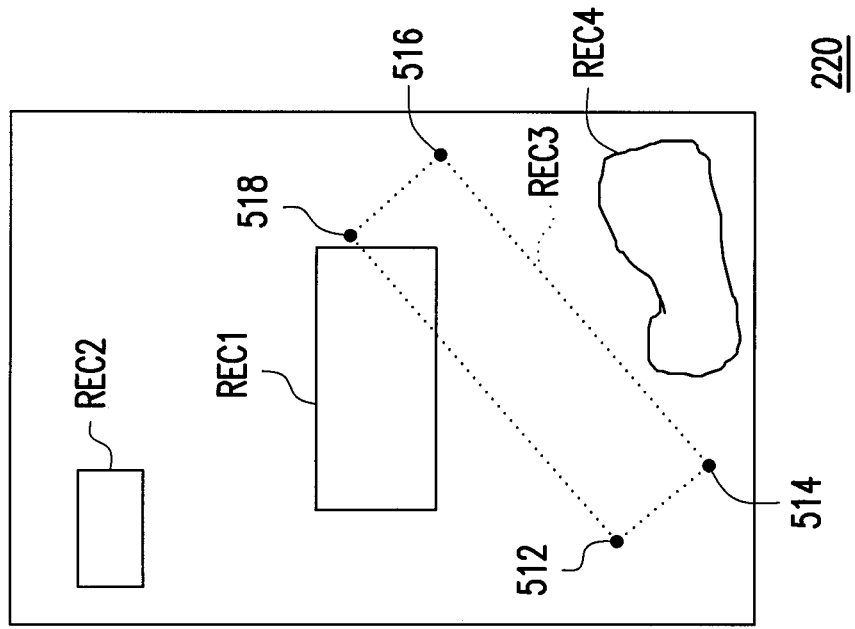
FIGS. 5A-5C are schematic diagrams respectively illustrating three kinds of information matching determination according to exemplary examples of the present application.
Figure 5A:
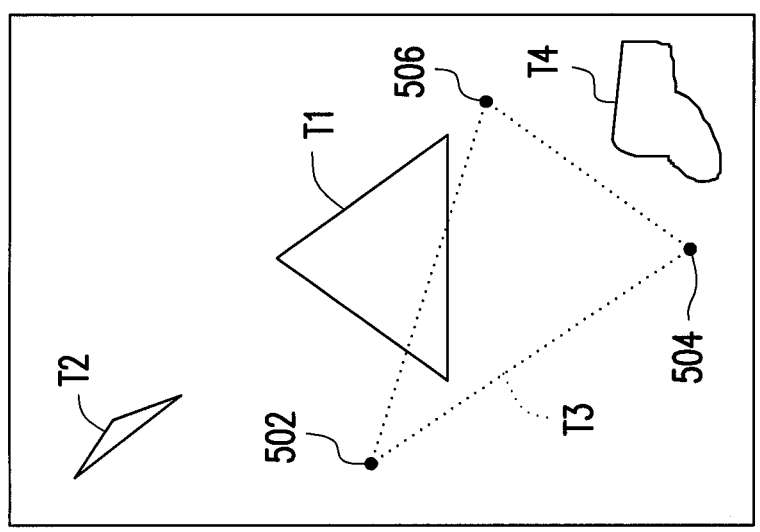
Figure 5C:
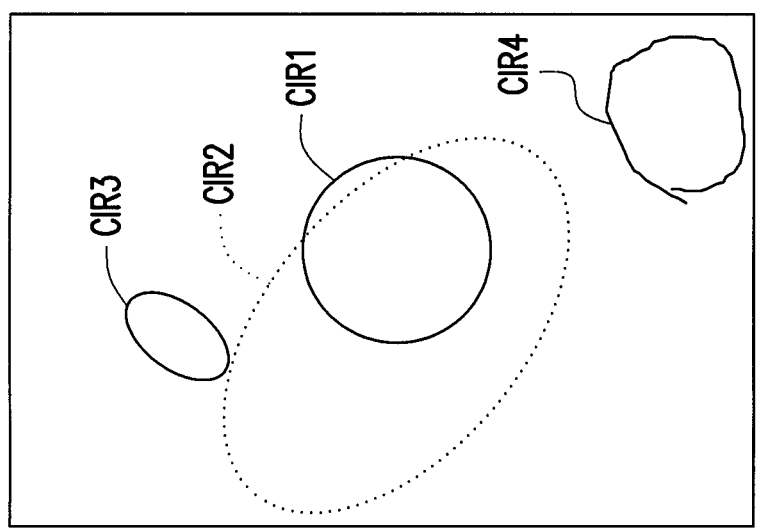

FIG. 5A-5C are schematic diagrams respectively illustrating three kinds of information matching determination according to exemplary examples of the present application. Referring to FIG. 5A, a triangle T1 is assumed to be the predetermined information (i.e., the first predetermined information or the second predetermined information). In this case, when a user can precisely input information of touch events or hover events by finger, palm, body parts or other objects and the inputted information is completely the same as the triangle T1 (i.e., the scale, the orientation, or the position of drawing are the same as the triangle T1), the processing unit 250 can surely determine the inputted information is matched to the triangle T1.

However, it is quite difficult for the user to perform such a precise input of information. In some examples, the inputted information may not be exactly the same as the triangle T1. For example, if the user inputs information (e.g., a gesture, a pattern or an image) similar to a triangle T2, which can be a shrunk, distorted, compressed and rotated version of the triangle T1 and in a different location to the triangle T1, the processing unit 250 may still determine that the triangle T2 is matched to the triangle T1 because the triangles T1 and T2 are "roughly similar" to each other. This concept may also be adopted to triangles T3 and T4. Although the triangle T3 appears to be an enlarged, distorted and rotated version of the triangle T1, the processing unit 250 can still determine that the triangle T3 is matched to triangle T1. The triangle T4 can be also a shrunk, distorted, compressed and rotated version of the triangle T1. The sides and the corners of the triangle T4 are even not straight or sharp. However, the processing unit 250 can still determine that the triangle T4 matches the triangle T1 because of their similar appearances.

Further, the order of drawing the image of touch events or hover events is also not strict in the present application. For example, the user may draw the triangle T3 in a counter-clockwise way (e.g., starting from the node 502 to the nodes 504, 506 and finally back to the node 502), in a clockwise way (e.g., starting from the node 504 to the nodes 502, 506 and finally back to the node 504) or in other ways that can finish the triangle T3. All of the ways of drawing the triangle T3 are valid because the resulting "image" of the mentioned drawing ways are the same, which lead to the same consequences, i.e., the triangle T3 is determined to be matched to the triangle T1.

Referring to FIG. 5B, a rectangle REC1 is assumed to be the predetermined information (i.e., the first predetermined information or the second predetermined information). Similarly, if a user can precisely input an image of touch events or hover events by finger, palm, body parts or other objects and the image is completely the same as the rectangle REC1, the processing unit 250 can also surely determine the inputted information is matched to the rectangle REC1. However, if the inputted information of the user appears to be like rectangles REC2-REC4, these inputted information may still be determined to be matched to the rectangle REC1 for their approximately similar appearances to the rectangle REC1. Since the order of drawing the image is not strict in the present application, the rectangle REC3 can be drawn in a counter-clockwise way (e.g., starting from the node 512 to the nodes 514, 516, 518 and finally back to the node 512), in a clockwise way (e.g., starting from the node 516 to the nodes 514, 512, 518 and finally back to the node 516) or in other ways that can finish the rectangle REC3. All of the ways of drawing the rectangle REC3 are valid because the resulting "image" of the aforementioned drawing ways are the same, which lead to the same consequences, i.e., the rectangle REC3 is determined to be matched to the rectangle REC1. Likewise, the processing unit 250 may still determine that the rectangle REC4 is matched to the rectangle REC1 because of their similar appearances.

Referring to FIG. 5C, a circle CIR1 is assumed to be the predetermined information (i.e., the first predetermined information or the second predetermined information). Similarly, when a user can precisely input information of touch events or hover events by finger, palm, body parts or other objects and the image is completely the same as circle CIR1, the processing unit 250 can also surely determine the inputted information is matched to the circle CIR1. However, when the inputted information of the user appears to be like the circles CIR2-CIR4, these inputted information may still be determined to be matched to the circle CIR1 for their approximately similar appearances to the circle CIR1.

In some examples, the processing unit 250 may determine whether the inputted information (e.g., a gesture) matches first predetermined information or second predetermined information during the display 210 is being disabled, and correspondingly adjust the characteristic of the audio signal AS. The first predetermined information may be a first reference point followed by a relative movement towards a first predetermined direction. The second predetermined information may be a second reference point followed by a relative movement towards a second predetermined direction, which is different from the first predetermined direction. It is assumed that the first predetermined information and the second predetermined information respectively correspond to the operation of volume-down and volume-up. Hence, when the processing unit 250 determines that the inputted information matches the first predetermined information, the volume/amplitude of the outputted audio signal AS may be correspondingly decreased. On the other hand, when the processing unit 250 determines that the inputted information matches the second predetermined information, the volume/amplitude of the outputted audio signal AS may be correspondingly increased, but the application is not limited thereto.

Similarly, the inputted information related touch events or hover events does not need to precisely follow the reference point and reference direction. As long as the inputted information, such as a gesture or an image (i.e., the touch point and the relative direction of the subsequent movement following the touch point), roughly matches the predetermined information, the processing unit 250 may perform the related information matching determination and adjust the volume/amplitude of the outputted audio signal AS based on the result of the determination.

Figure 6B:
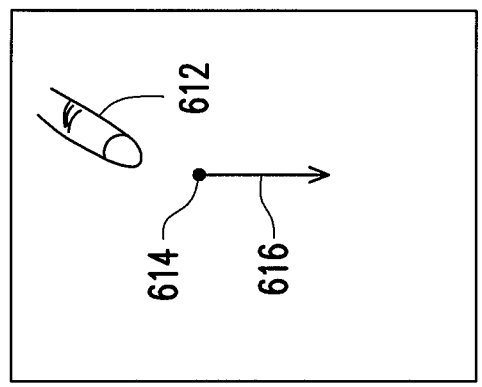
FIGS. 6A-6B, 7A-7B and 7C-7D are schematic diagrams respectively illustrating different kinds of information matching determinations according to exemplary examples.
Figure 6A:
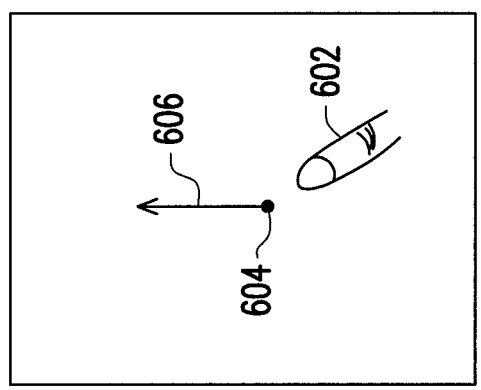

FIGS. 6A-6B, 7A-7B and 7C-7D are schematic diagrams respectively illustrating different kinds of information matching determinations according to exemplary examples. Referring to FIG. 6A, when a finger 602 touches or hovers above a second reference point 604 and performs a relative movement towards a second predetermined direction 606, the volume of the electronic device 200 may be increased by the processing unit 250. In this case, as long as the direction of the relative movement of the inputted information is moving, but not limited to, upward, upper right, or upper left, the processing unit 250 may determine that the inputted information of touch events or hover events matches the second predetermined information and increase the volume/amplitude of the outputted audio signal AS, because these movements are approximately similar to the second predetermined information.

Referring to FIG. 6B, when a finger 612 of the user touches on or hovers above a first reference point 614 and performs a relative movement towards a first predetermined direction 616, the volume of the electronic device 200 may be decreased. In this case, as long as the direction of the relative movement of the input image is moving, but not limited to, downwards, bottom right or bottom left, the processing unit 250 may determine that the inputted information of touch event of hover events matches the first predetermined information, and decrease the volume/amplitude of the outputted audio signal AS, because these movements are approximately similar to the first predetermined information.

Figure 7B:
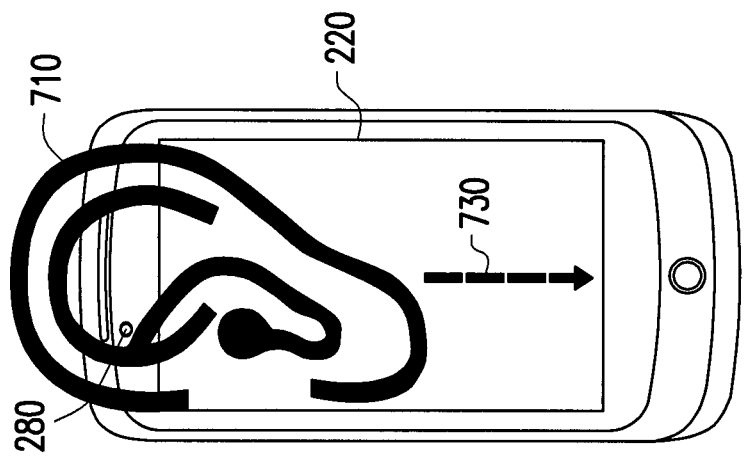
Figure 7A:
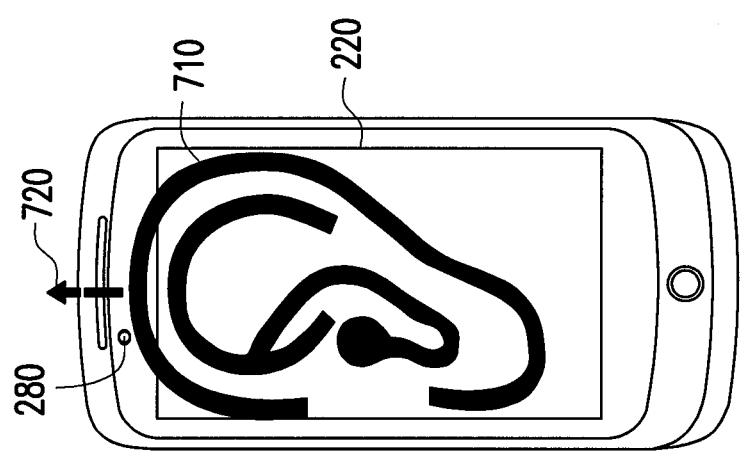

Referring to FIG. 7A, when an ear 710 of the user touches on or hovers above the touch sensor 220 and moves along a direction 720, the processing unit 250 may determine that the inputted information (of the touch event or the hover event) matches the second predetermined information, and increase the volume of the electronic device 200. It is noted that the direction of the relative movement does not need to be exactly upward. In this case, as previously mentioned, when the direction of the relative movement of the inputted information (of the touch event or the hover event) is toward upper left or upper right, the processing unit 250 may still determine that the inputted information (of the touch event or the hover event) matches the second predetermined information, and then increase the volume/amplitude of the outputted audio signal AS.

Referring to FIG. 7B, when the ear 710 touches on or hovers above the touch sensor 220 and moves along a direction 730, the processing unit 250 may determine that the inputted information (of the touch event or the hover event) matches the first predetermined information and then decrease the volume of the electronic device 200. It is noted that the direction of the relative movement does not need to be exactly downward. In this case, as previously mentioned, when the direction of the relative movement of the image (of the touch event or the hover event) is toward bottom left or bottom right, the processing unit 250 may still determine that the image (of the touch event or the hover event) matches the first predetermined information, and then decrease the volume/amplitude of the outputted audio signal AS.

After a user uses the electronic device 200 to establish a voice call, the user may use the user's finger or body object to control audio output volume of the outputted audio signal AS of the electronic device 200. For example, referring to FIG. 7C, when the user holds the electronic device close to the user's face, the user may use a finger 740 touch on or hover above the touch sensor 220 and moves along a direction 750. Then, the processing unit 250 may determine that the inputted information (of the touch event or the hover event) matches a first predetermined information, and then increase the volume/amplitude of the outputted audio signal AS. It is noted that the direction of the relative movement does not need to be exactly upward. In this case, as previously mentioned, when the direction of the relative movement of the inputted information (of the touch event or the hover event) is toward upper left or upper right, the processing unit 250 may still determine that the inputted information (of the touch event or the hover event) matches the first predetermined information, and then increase the volume of the outputted audio signal AS.

Figure 7D:
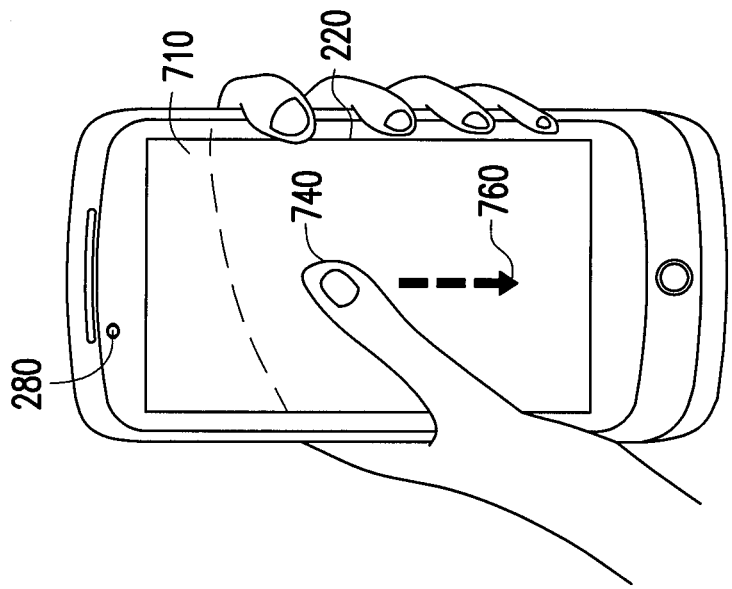
Figure 7C:
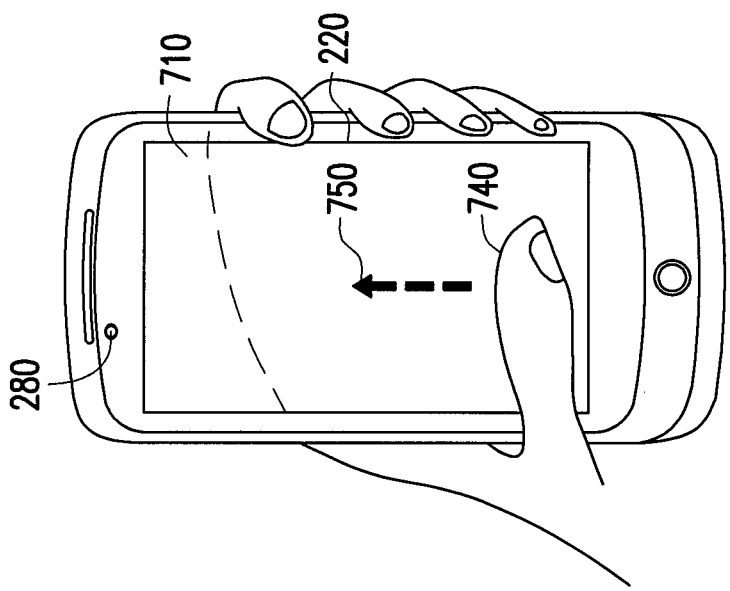

For another example, referring to FIG. 7D, when the user holds the electronic device close to the user's face during a voice call, the user may use the finger 740 touch on or hover above the touch sensor 220 and moves along a direction 760. Then, the processing unit 250 may determine that the inputted information (of the touch event or the hover event) matches a second predetermined information, and then decrease the volume/amplitude of the outputted audio signal AS. It is noted that the direction of the relative movement does not need to be exactly upward. In this case, as mentioned previously, when the direction of the relative movement of the image (of the touch event or the hover event) is toward bottom left or bottom right, the processing unit 250 may still determine that the inputted information (of the touch event or the hover event) matches the second predetermined information, and then decrease the volume/amplitude of the outputted audio signal AS.

FIGS. 8A-8C, 9A-9B are schematic diagrams respectively illustrating a calling situation according to an exemplary examples. Referring to FIG. 8A, FIG. 8A illustrates that the electronic device 200 receives a telephone call and a finger 810 of the user touches an answer button 820 to answer the telephone call. Referring to FIG. 8B, FIG. 8B depicts that the user of finger 810 has answered the call but yet to put the electronic device close to the ear. Since the user of finger 810 has not put the electronic device 200 close to the ear/face/other object of the user, i.e., no touch events or hover events are sensed by the sensing elements 222 in the touch sensor 220 or by the sensor 280 of the electronic device 200, the display 210 has not been deactivated in FIG. 8B.

Referring to FIG. 8C, FIG. 8C illustrates that the user has put the electronic device 200 close to the ear 710. Then, the sensing elements 222 in the touch sensor 220 or the sensor 280 of the electronic device 200 may sense that there occur some touch events or hover events, which is triggered by the ear 710, the processing unit 250 may control the driving circuitry 230 to deactivate the display 210 in order to save power. Meanwhile, the sensing circuitry 240 of the electronic device 200 may still maintain detection functionality of the touch sensor 220 by the aforementioned partially charging mechanism.

Figure 9A:
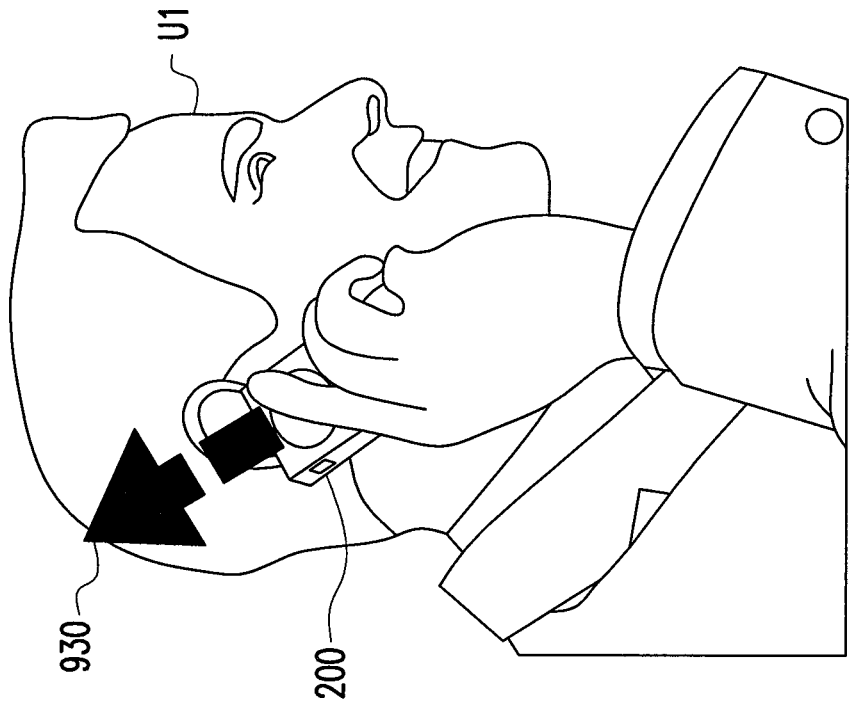

When the user of the electronic device 200 wants to increase the audio volume of the outputted audio signal AS during the telephone call, the user may simply pull the electronic device 200 downward against the face or ear of the user, which results in a relative upward ear movement similar to the movement illustrated in FIG. 7A. The processing unit 250 of the electronic device 200 will determine that the inputted information of the touch events or hover events input by the ear 710 matches to the second predetermined information as in FIG. 7A. This movement of pulling the electronic device 200 downward may look like the operation illustrated in FIG. 9A. In FIG. 9A, the user U1 pulls the electronic device 200 against the user's face or ear and toward a direction 920 to make the volume of the outputted audio signal AS increased.

Figure 9B:
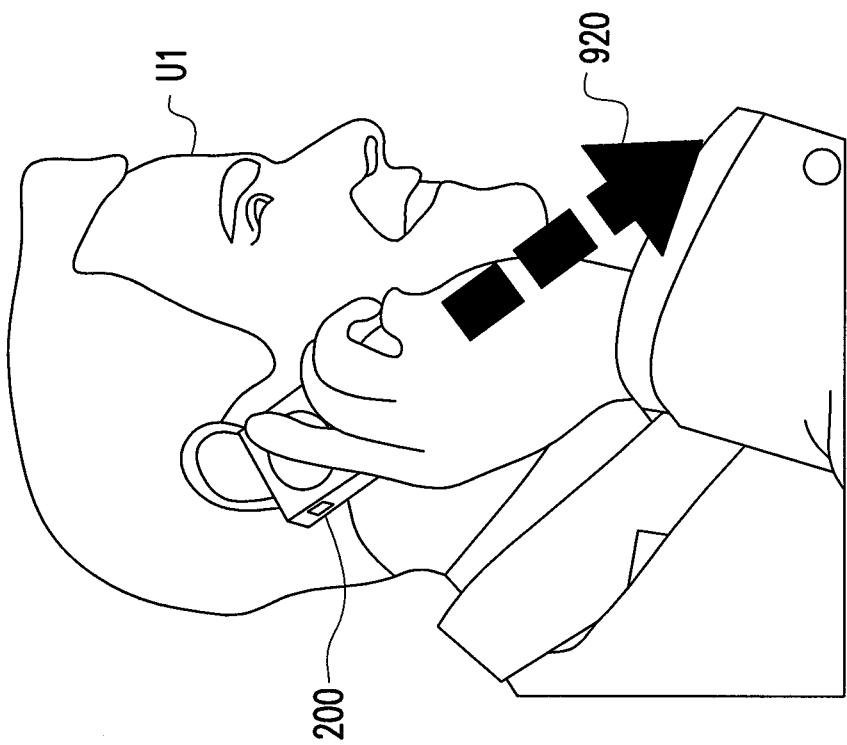

When the user of the electronic device 200 wants to decrease the volume of the outputted audio signal AS during the telephone call, the user may simply push the electronic device 200 upward, which results in a relative downward ear movement similar to the movement illustrated in FIG. 7B. The processing unit 250 may determine that the inputted information of the touch events or hover events input by the ear 710 matches to the first predetermined information as in FIG. 7B. This movement of pushing the electronic device 200 upward may look like the operation illustrated in FIG. 9B. In FIG. 9B, the user U1 pushes the electronic device 200 toward a direction 930 to make the volume of the outputted audio signal AS decreased.

In summary, examples of the application provide the method for controlling volume of an electronic device and the electronic device using the same method. The proposed method allows the user of the electronic device adjust the characteristic (e.g., volume) of the outputted audio signal of the electronic device by inputting some information (e.g., a pattern, an image or a gesture) on or near the touch sensor of the electronic device. Accordingly, the electronic device adjusts the characteristic (e.g., volume) based on the inputted information of the user. Therefore, the volume switch actuator is no longer required, thereby leaving the housing of the electronic device no longer requiring placement holes for the volume switch actuator. In addition, by automatically deactivating the display of the electronic device when a telephone call is established, the power consumption of the electronic device may be reduced. The power consumption may be further reduced by partially charging the sensing elements in the touch sensor.

It will be apparent to those skilled in the art that various modifications and variations may be made to the structure of the application without departing from the scope or spirit of the application. In view of the foregoing, it is intended that the application cover modifications and variations of this application provided they fall within the scope of the following claims and their equivalents.

What is claimed is:

1. A method for controlling audio volume of an electronic device having a speaker module, a display and a touch sensor disposed on the display, comprising:
    changing driving frequency of the touch sensor from a first frequency to a second frequency when the display is disabled from displaying an image;
    receiving a sensing signal from the touch sensor according to the second driving frequency;
    determining inputted information based on the received sensing signal;
    changing an audio signal of the electronic device according to the determined inputted information; and
    outputting the changed audio signal.

2. The method of claim 1, further comprising:
    receiving a data encoded with the audio signal;
    detecting an object proximate the electronic device by using a sensor on the electronic device; and
    disabling the display from displaying an image.

3. The method of claim 1, wherein the received sensing signal is generated by the touch sensor when an object touches on the touch sensor or hovers above the touch sensor.

4. The method of claim 1, wherein determined inputted information is determined by calculating the received sensing signal over a period of time.

5. The method of claim 1, wherein driving the touch sensor when the display is disabled from displaying the image further comprises driving a portion of the touch sensor to sense a touch on or above the touch sensor to generate the received sensing signal.

6. The method of claim 1, wherein the step of driving the touch sensor when the display is disabled from displaying the image further comprises partially charging a plurality of sensing elements on the touch sensor to sense a touch on or above the touch sensor to generate the received sensing signal.

7. The method of claim 1, wherein the step of changing the audio signal of the electronic device comprises:
transmitting the audio signal to a speaker module; and
adjusting the speaker module for changing a characteristic of the audio signal.

8. The method of claim 7, wherein the characteristic of the audio signal comprises audio volume, amplitude, frequency, pitch, or signal to noise ratio.

9. The method of claim 7, wherein adjusting the speaker module further comprises changing a gain of the speaker module.

10. An electronic device, comprising:
a display, configured to display an image;
a touch sensor, disposed on the display and configured to detect a contact on the touch sensor and sensing a touch on or above the touch sensor to generate a sensing signal when the display is not driven to display the image;
a driving circuitry, coupled to the display and the touch sensor, and configured to drive the display and the touch sensor and change driving frequency from a first driving frequency to a second driving frequency when the display is disabled from displaying the image;
a sensing circuitry, coupled to the touch sensor, configured to receive the sensing signal according to the second driving frequency and determining inputted information based on the received sensing signal;
a processing unit coupled to the driving circuitry and the sensing circuitry, transmitting an audio signal; and
a speaker module, coupled to the processing unit, outputting the audio signal;
wherein when the display is disabled from displaying the image, the sensing circuitry determines the inputted information according to the received sensing signal and the processing unit changes the audio signal according to the determined inputted information.

11. The electronic device of claim 10, wherein the contact is provided by any combination of one or more finger, a face, a palm, a pen or a hover-based input to the touch sensor.

12. The electronic device of claim 10, wherein the touch sensor comprises a plurality of sensing elements arranged in rows and columns, and the driving circuitry drives a portion of the sensing elements.

13. The electronic device of claim 10, wherein the received sensing signal is generated by the touch sensor when an object touches on the touch sensor or hovers above the touch sensor.

14. The electronic device of claim 10, wherein the determined inputted information is determined by calculating the received sensing signal over a period of time.

15. The electronic device of claim 10, wherein the touch sensor comprises a plurality of sensing elements arranged in rows and columns, and the driving circuitry partially charges the plurality of sensing elements.

16. The electronic device of claim 10, further comprising a sensor coupled to the processing unit, sensing a property of an object or an environment external to the electronic device and generating a sensing information based on the sensed property, wherein the display is not driven when the electronic device is coupled to a network for receiving a data encoded with the audio signal and the processing unit determines an object proximate the electronic device based on the sensing information.

17. The electronic device of claim 16, wherein the sensing information is an electrical signal as a function of the property of an object sensed by the sensor or the environment external to the electronic device imposed on the sensor.

18. The electronic device of claim 16, further comprising a wireless module, coupled to the processing unit and receiving the data from the network and transmitting the data to the processing unit to generate the audio signal.

19. The electronic device of claim 10, wherein the processing unit further comprises an audio amplifier coupled to the speaker module, or an audio filter coupled to the speaker module.

20. The electronic device of claim 19, wherein the processing unit changes a characteristic of the audio signal, and output the changed audio signal by using the speaker module.

21. The electronic device of claim 20, wherein the characteristic of the audio signal comprises audio volume, amplitude, frequency, pitch, or signal to noise ratio.

\* \* \* \* \*